(12) United States Patent
Zhang et al.

(10) Patent No.: US 8,807,078 B2
(45) Date of Patent: Aug. 19, 2014

(54) PLASMA MICROWAVE RESONANT CAVITY

(75) Inventors: Jinyan Zhang, Hubei (CN); Ruichun Wang, Hubei (CN); Xianhui Xia, Hubei (CN)

(73) Assignee: Yangze Optical Fibre and Cable Company Ltd., Wuhan, Hubei (CN)

( * ) Notice: Subject to any disclaimer, the term of this patent is extended or adjusted under 35 U.S.C. 154(b) by 0 days.

(21) Appl. No.: 14/116,889

(22) PCT Filed: Mar. 13, 2012

(86) PCT No.: PCT/CN2012/072226
§ 371 (c)(1),
(2), (4) Date: Nov. 11, 2013

(87) PCT Pub. No.: WO2012/174890
PCT Pub. Date: Dec. 27, 2012

(65) Prior Publication Data
US 2014/0062300 A1    Mar. 6, 2014

(30) Foreign Application Priority Data

Jun. 24, 2011 (CN) .......................... 2011 1 0172062

(51) Int. Cl.
*C23C 16/00* (2006.01)
*C03B 37/018* (2006.01)
*C23C 16/511* (2006.01)
*H01J 37/32* (2006.01)

(52) U.S. Cl.
CPC ....... *H01J 37/32247* (2013.01); *C03B 37/0183* (2013.01); *C23C 16/511* (2013.01); *H01J 37/32192* (2013.01); *H01J 37/32229* (2013.01)
USPC .................................. 118/723 MW; 333/227

(58) Field of Classification Search
USPC ............. 118/723 MW; 156/345.41; 333/227, 333/248, 99 PL
See application file for complete search history.

(56) References Cited

U.S. PATENT DOCUMENTS 4,965,540 A * 10/1990 Sullivan ......................... 333/227
5,311,103 A * 5/1994 Asmussen et al. ........ 315/111.81
(Continued)

FOREIGN PATENT DOCUMENTS

| CN | 1490268 A | 4/2004 |
|---|---|---|
| CN | 1589089 A | 3/2005 |

(Continued)

OTHER PUBLICATIONS

State Intellectual Property Office of the People's Republic of China, "Office Action", China, Oct. 16, 2012.

(Continued)

*Primary Examiner* — Thuy Vinh Tran
(74) *Attorney, Agent, or Firm* — Morris Manning & Martin LLP; Tim Tingkang Xia, Esq.

(57) ABSTRACT

A plasma microwave resonant cavity used for a plasma chemical vapor deposition (PCVD) apparatus comprises a resonant cavity housing and a waveguide device connected with the cavity housing. Two ends of the cavity housing are provided with coaxial through-holes along the axial direction of the cavity. A glass inner liner is arranged through the through-holes at the two ends, and runs through a cavity body and the through holes at the two ends. The glass inner liner comprises a glass cylinder and glass stop rings arranged at the two ends of the glass cylinder. One or two ends of the glass cylinder are provided with external threads. The glass stop rings are connected with the ends of the glass cylinder by screw holes formed on the glass stop rings.

12 Claims, 2 Drawing Sheets

(56) References Cited

U.S. PATENT DOCUMENTS

| | | | | |
|---|---|---|---|---|
| 5,902,404 | A | * | 5/1999 | Fong et al. ............. 118/723 ME |
| 6,260,510 | B1 | * | 7/2001 | Breuls et al. .......... 118/723 MW |
| 6,372,305 | B2 | * | 4/2002 | Breuls et al. .................. 427/575 |
| 6,715,441 | B2 | * | 4/2004 | Breuls et al. .......... 118/723 MW |
| 8,337,764 | B2 | | 12/2012 | Yang et al. .................... 422/186 |
| 8,662,011 | B2 | * | 3/2014 | Van Stralen et al. .. 118/723 MW |

FOREIGN PATENT DOCUMENTS

| | | |
|---|---|---|
| CN | 1858298 A | 11/2006 |
| CN | 1858299 A | 11/2006 |
| CN | 101853768 A | 10/2010 |
| CN | 102263000 A | 11/2011 |
| JP | 2005247680 A | 9/2005 |

OTHER PUBLICATIONS

State Intellectual Property Office of the People's Republic of China, "International Search Report", China, Jul. 12, 2012.

State Intellectual Property Office of the People's Republic of China (ISA/CN), "Written Opinion of the International Search Authority", China, Jul. 12, 2012.

The International Bureau of WIPO, "International Preliminary Report on Patentability", Switzerland, Dec. 24, 2013.

* cited by examiner

PLASMA MICROWAVE RESONANT CAVITY

FIELD OF THE INVENTION

The present invention relates generally to a resonant cavity; and more particularly, to a plasma microwave resonant cavity usable for a PCVD optical fiber preform rod lathe, which is an improvement to an existing plasma microwave resonant cavity.

BACKGROUND OF THE INVENTION

Plasma chemical vapor deposition (PCVD) is a main process for optical fiber preform rod processing, and a plasma microwave resonant cavity is a core part of a PCVD processing apparatus. The plasma microwave resonant cavity mainly includes a resonant cavity housing and a waveguide device connected to the resonant cavity housing. Coaxial through-holes are opened on two ends of the resonant cavity housing along an axial direction of the resonant cavity, a glass inner liner is disposed via the through-holes at the two ends and penetrates the resonant cavity and the through-holes at the two ends, and glass stop rings are disposed at two ends of the glass inner liner and used for axial positioning of the glass inner liner. In the prior art, the glass stop ring at one end of the glass inner liner is integrally formed with a glass cylinder of the glass inner liner in manufacturing, and the glass stop ring at the other end of the glass inner liner needs to be manufactured in a manner that the glass stop ring is mounted at an end of the glass cylinder after the glass inner liner is mounted to the resonant cavity housing and then the end of the glass cylinder is melted through hydrogen and oxygen combustion and turned inside out to press against the glass stop ring.

The structure of the glass inner liner has the following problems: (1). the field installation is complex and of high operation difficulty, and since the quartz glass needs to be melted at a temperature above 2000° C., in this high-temperature environment, the metal at the end of the resonant cavity may easily diffuse to the quartz glass inner liner and further diffuse to a deposition tube in the PCVD deposition process, so that the attenuation of the optical fiber preform increases and affects the processing quality of the optical fiber preform; (2). the glass which is melted and then turned inside out has certain stress after cool down, so that glass cracking and breakage may easily occur in use, and in a more serious case, product rejection and even damages to the apparatus may be caused; (3). if the mounted glass ring gets loose in use, fastening is required; however, the effect of secondary fastening of glass is undesirable and can hardly reach the requirement, which may affect the processing performance of the apparatus as well as the stability of the product quality; and (4). since the quartz glass inner liner and the glass stop ring are adhered at a high temperature, destructive detachment needs to be performed on the quartz glass inner liner and the stop ring when the resonant cavity is maintained or checked, and in this case, a new glass inner liner needs to be replaced and the cracked glass fragment may easily fall into the resonant cavity to cause damages to the resonant cavity.

Therefore, a heretofore unaddressed need exists in the art to address the aforementioned deficiencies and inadequacies.

SUMMARY OF THE INVENTION

One of the objectives of the present invention is to provide a plasma microwave resonant cavity which can be easily mounted and detached and has good installation quality and stable performance in use is provided to eliminate the defects in the prior art.

In one aspect of the invention, the plasma microwave resonant cavity includes a resonant cavity housing and a waveguide device connected to the resonant cavity housing. Coaxial through-holes are defined on two ends of the resonant cavity housing along an axial direction of the resonant cavity. A glass inner liner is disposed via the through-holes at the two ends and penetrates the body of the resonant cavity and the through-holes at the two ends. The glass inner liner includes a glass cylinder and a glass stop ring disposed at two ends of the glass cylinder. An external thread is provided at one or two ends of the glass cylinder, and the glass stop ring is connected to an end of the glass cylinder through a screw hole disposed therein.

In one embodiment, one end of the glass cylinder is provided with a fixed glass stop ring integrally connected thereto, and the other end of the glass cylinder is provided with an external thread and connected to a screw hole of the glass stop ring, to form the glass stop ring with threaded connection at one end.

In one embodiment, the glass cylinder and the glass stop ring are both made of quartz glass.

In one embodiment, the diameter of the glass cylinder ranges from 30 mm to 80 mm, the external thread provided at the end of the glass cylinder is a fine thread with a pitch of 3 mm to 0.85 mm, and the axial length of the whole external thread ranges from 10 mm to 20 mm.

In one embodiment, the glass stop ring is in an annular shape and the screw hole thereof is fitted with the external thread of the glass cylinder, the axial thickness of the glass stop ring ranges from 3 mm to 15 mm, and a radial single-side width of the annular body ranges from 10 mm to 35 mm.

In one embodiment, a movable glass retaining ring is fitted on an inner side of the glass stop ring at one or two ends of the glass cylinder.

In one embodiment, the resonant cavity housing is a cylindrical resonant cavity housing or coaxial resonant cavity housing.

Among other things, the present invention has the following beneficial effects. (1). When the resonant cavity is mounted for use, the glass inner liner penetrates the resonant cavity and the through-holes at the two ends, the glass stop ring is engaged with the external thread at the end, and the glass stop ring is tightened to complete the installation and positioning of the glass inner liner. In this manner, the resonant cavity can be easily mounted and adjusted, the difficulty of field installation is greatly reduced, and high-temperature hydrogen and oxygen combustion is not required, which effectively avoids diffusion of metallic elements of the resonant cavity under a high temperature and thus ensures stable performance and quality of a produced optical fiber perform. (2). The glass inner liner adopts a threaded mounting and locking structure, which effectively avoids the defect that the quartz glass may easily produce stress after being melted, turned inside out and cooled down, so as to prevent glass cracking and breakage in use and prolong the service life of the glass inner liner. (3). When the glass inner liner gets loose in use, the glass stop ring only needs to be further tightened by a distance, the glass inner liner can be easily detached for maintenance and check through the glass stop ring, and the detached glass inner liner can be easily mounted and positioned again, so that the maintenance and check cost of apparatuses is greatly reduced, and the detachment and installation may not cause any glass fragment, which further improves the stability of the performance of the plasma microwave resonant cavity in use.

These and other aspects of the present invention will become apparent from the following description of the preferred embodiment taken in conjunction with the following drawings, although variations and modifications therein may be affected without departing from the spirit and scope of the novel concepts of the invention

BRIEF DESCRIPTION OF THE DRAWINGS

The accompanying drawings illustrate one or more embodiments of the invention and together with the written description, serve to explain the principles of the invention. Wherever possible, the same reference numbers are used throughout the drawings to refer to the same or like elements of an embodiment.

DESCRIPTION OF EMBODIMENTS OF THE INVENTION

Figure 1:
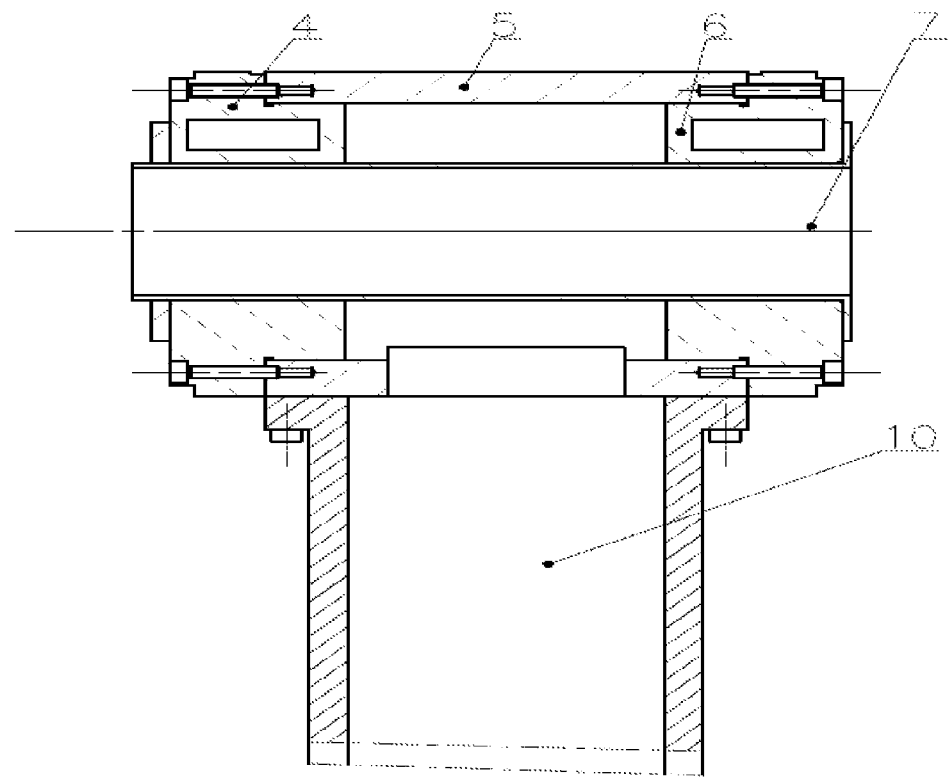
FIG. 1 is a front cross-sectional structural view of a plasma microwave resonant cavity according to one embodiment of the present invention.

The present invention is more particularly described in the following examples that are intended as illustrative only since numerous modifications and variations therein will be apparent to those skilled in the art. Various embodiments of the invention are now described in detail in conjunction with the accompanying drawings. Referring to the drawings, like numbers indicate like components throughout the views.

In accordance with the purposes of this invention, as embodied and broadly described herein, this invention, in one aspect, relates to a rotary seal chuck deposed at a plasma microwave resonant cavity usable for a PCVD optical fiber preform rod lathe.

Figure 3:
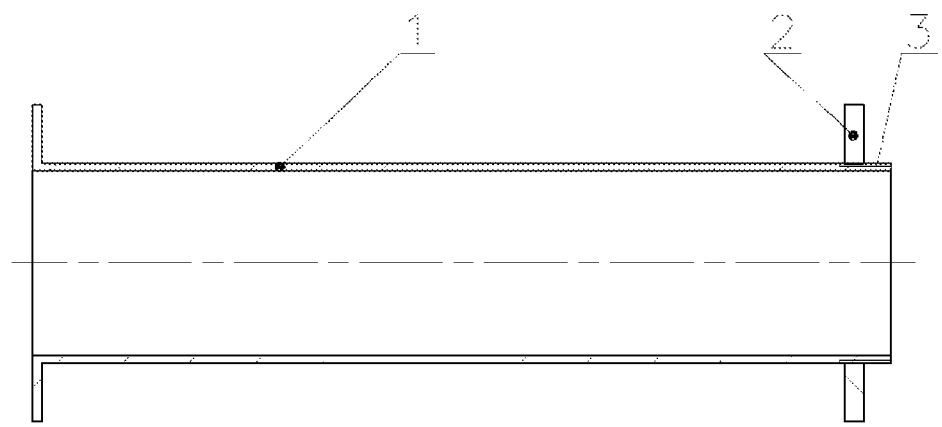
FIG. 3 is a front cross-sectional structural view of a glass inner liner according to one embodiment of the present invention.

A first embodiment shown in FIGS. 1 and 3 provides a cylindrical resonant cavity, which includes a resonant cavity housing 5 and a waveguide device 10 connected to one side of the resonant cavity housing 5. A left and right end covers 4, 6 are disposed at two ends of the resonant cavity housing. The left and right end covers are opened with coaxial through-holes in an axial direction of the resonant cavity. A glass inner liner 7 is disposed via the left and right end through-holes and penetrates the body of the resonant cavity and the through-holes at the two ends. The glass inner liner includes a glass cylinder 1 with an external diameter of 60 mm. One end of the glass cylinder is provided with a fixed glass stop ring integrally connected thereto, and the other end of the glass cylinder is provided with an external thread 3. The external thread is a fine thread with a pitch of 1.5 mm, the axial length of the whole external thread is 15 mm, and the external thread is connected to the glass stop ring 2 provided with a screw hole, to form the glass stop ring with threaded connection at one end. The glass stop ring 2 is in an annular shape, and the screw hole of the glass stop ring 2 is fitted with the external thread of the glass cylinder. The axial thickness of the glass stop ring is 6 mm, and a radial single-side width of the annular body is 18 mm. The glass cylinder and the glass stop ring are both made of quartz glass. The fixed glass stop ring is integrally formed with the glass cylinder.

Figure 2:
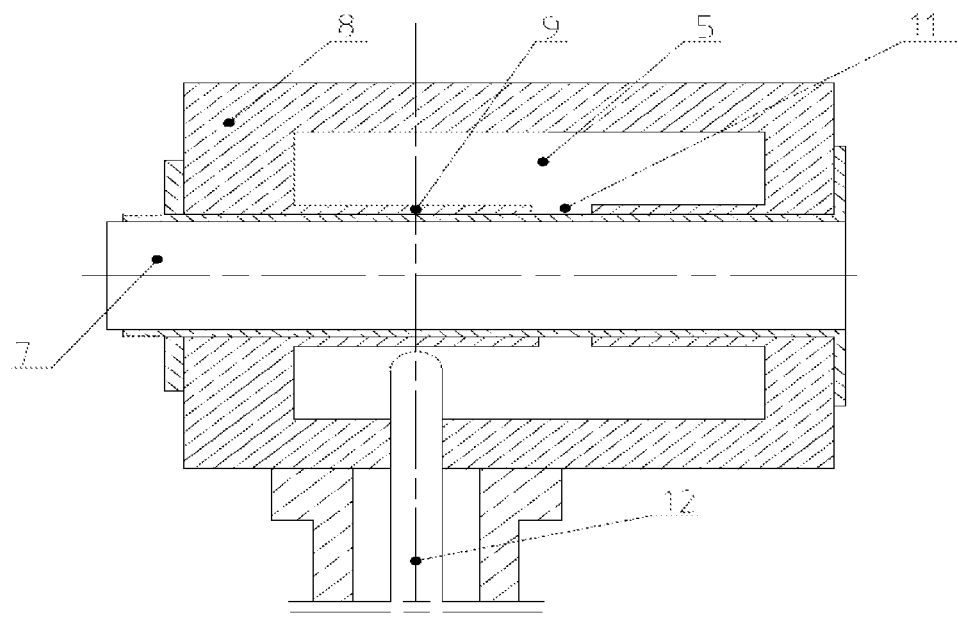
FIG. 2 is a front cross-sectional structural view of a plasma microwave resonant cavity according to another embodiment of the present invention.

A second embodiment shown in FIG. 2 provides a coaxial resonant cavity. The difference between this embodiment and the first embodiment mainly lies in that, a resonant cavity housing 8 of the coaxial resonant cavity is provided with two coaxial sleeves 9, the two coaxial sleeves have a slit 11 therebetween, and the glass inner liner penetrates inner holes of the two coaxial sleeves and passes through the resonant cavity in the axial direction. The waveguide device is provided with a waveguide antenna 12 therein.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to enable others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. A plasma microwave resonant cavity, comprising:
   a resonant cavity housing; and
   a waveguide device connected to the resonant cavity housing,
   wherein coaxial through-holes are defined on two ends of the resonant cavity housing along an axial direction of the resonant cavity;
   wherein a glass inner liner is disposed via the through-holes at the two ends and penetrates the body of the resonant cavity and the through-holes at the two ends, wherein the glass inner liner comprises a glass cylinder and a glass stop ring disposed at two ends of the glass cylinder;
   wherein an external thread is provided at one or two ends of the glass cylinder, and wherein the glass stop ring is connected to an end of the glass cylinder through a screw hole disposed therein.

2. The plasma microwave resonant cavity according to claim 1, wherein one end of the glass cylinder is provided with a fixed glass stop ring integrally connected thereto, and the other end of the glass cylinder is provided with an external thread and connected to a screw hole of the glass stop ring to form the glass stop ring with threaded connection at one end.

3. The plasma microwave resonant cavity according to claim 2, wherein both the glass cylinder and the glass stop ring are made of quartz glass.

4. The plasma microwave resonant cavity according to claim 2, wherein the diameter of the glass cylinder ranges from 30 mm to 80 mm, the external thread provided at the end of the glass cylinder is a fine thread with a pitch of 3 mm to 0.85 mm, and the axial length of the whole external thread ranges from 10 mm to 20 mm.

5. The plasma microwave resonant cavity according to claim 2, wherein the glass stop ring is in an annular shape and the screw hole of the glass stop ring is fitted with the external thread of the glass cylinder, the axial thickness of the glass stop ring ranges from 3 mm to 15 mm, and a radial single-side width of the annular body ranges from 10 mm to 35 mm.

6. The plasma microwave resonant cavity according to claim 2, wherein a movable glass retaining ring is fitted on an inner side of the glass stop ring at one or two ends of the glass cylinder.

7. The plasma microwave resonant cavity according to claim 2, wherein the resonant cavity housing is a cylindrical resonant cavity housing or coaxial resonant cavity housing.

8. The plasma microwave resonant cavity according to claim 1, wherein both the glass cylinder and the glass stop ring are made of quartz glass.

9. The plasma microwave resonant cavity according to claim 1, wherein the diameter of the glass cylinder ranges from 30 mm to 80 mm, the external thread provided at the end of the glass cylinder is a fine thread with a pitch of 3 mm to 0.85 mm, and the axial length of the whole external thread ranges from 10 mm to 20 mm.

10. The plasma microwave resonant cavity according to claim 1, wherein the glass stop ring is in an annular shape and the screw hole of the glass stop ring is fitted with the external thread of the glass cylinder, the axial thickness of the glass stop ring ranges from 3 mm to 15 mm, and a radial single-side width of the annular body ranges from 10 mm to 35 mm.

11. The plasma microwave resonant cavity according to claim 1, wherein a movable glass retaining ring is fitted on an inner side of the glass stop ring at one or two ends of the glass cylinder.

12. The plasma microwave resonant cavity according to claim 1, wherein the resonant cavity housing is a cylindrical resonant cavity housing or coaxial resonant cavity housing.

\* \* \* \* \*